United States Patent
Enlund

(10) Patent No.: US 6,397,933 B1
(45) Date of Patent: Jun. 4, 2002

(54) METHOD AND DEVICE FOR COOLING OF ELECTRONIC/COMPUTER EQUIPMENT AND USE THEREOF

(75) Inventor: Svante Enlund, Saltsjöbaden (SE)

(73) Assignee: Telia AB, Farsta (SE)

( * ) Notice: Subject to any disclaimer, the term of this patent is extended or adjusted under 35 U.S.C. 154(b) by 0 days.

(21) Appl. No.: 09/355,334

(22) PCT Filed: Jan. 30, 1998

(86) PCT No.: PCT/SE98/00144

§ 371 (c)(1),
(2), (4) Date: Oct. 7, 1999

(87) PCT Pub. No.: WO98/34450

PCT Pub. Date: Aug. 6, 1998

(30) Foreign Application Priority Data

Feb. 4, 1997 (SE) .................................................. 9700411

(51) Int. Cl.$^7$ ............................................. F28D 15/00
(52) U.S. Cl. ............................. 165/104.13; 165/104.33; 165/45; 454/284; 454/329; 454/338
(58) Field of Search ...................... 165/104.13, 104.19, 165/104.31, 104.33, 45; 361/696, 698, 699; 454/185, 186, 284, 329, 338

(56) References Cited

U.S. PATENT DOCUMENTS

| | | | | |
|---|---|---|---|---|
| 1,875,684 A | * | 9/1932 | Waterbury | .................. 454/329 |
| 3,630,174 A | * | 12/1971 | Runkle et al. | .......... 454/284 X |
| 3,962,608 A | | 6/1976 | Forster et al. | |
| 4,805,521 A | * | 2/1989 | Eckebring et al. | .......... 454/284 |
| 5,035,281 A | * | 7/1991 | Neuenfeldt et al. | ..... 165/104.33 |
| 5,323,847 A | * | 6/1994 | Koizumi et al. | ........ 165/104.33 |
| 5,409,419 A | | 4/1995 | Euchner et al. | |
| 5,419,679 A | | 5/1995 | Gaunt et al. | |
| 5,671,805 A | * | 9/1997 | Stahl et al. | .......... 165/104.33 X |
| 5,806,583 A | * | 9/1998 | Suzuki et al. | ........... 165/104.33 |

FOREIGN PATENT DOCUMENTS

| | | | | |
|---|---|---|---|---|
| DE | 937 298 | * | 1/1956 | ............. 165/104.33 |
| DE | 37 00 708 | | 7/1988 | |
| JP | 55-46870 | * | 4/1980 | ............. 156/104.33 |
| JP | 58-6336 | * | 1/1983 | ............. 165/104.33 |

OTHER PUBLICATIONS

Derwent Publications, Ltd., Derwent Abstracts, vol. 4, AN 87–219959, SU 1274–165, Nov. 30, 1986.

* cited by examiner

*Primary Examiner*—Harold Joyce
(74) *Attorney, Agent, or Firm*—Oblon, Spivak, McClelland, Maier & Neustadt, P.C.

(57) ABSTRACT

A cooling system for cooling electronic/computer equipment in an equipment room in a station. A fan device causes heat exchanging air circulation between a battery and the equipment, where the air is guided by an air guiding device. The air guiding device is in a first chamber with an inlet which communicates with a battery and a second chamber with an outlet which communicates with the equipment. The first and second chambers are separated by a low impulse device preferably in the form of a perforated partition wall equipped with filter cloth. Turbulent flow which leaves the fan changes the laminar flow when the flow is towards the equipment so that warm surrounding air is not mixed in the air flow.

15 Claims, 4 Drawing Sheets

METHOD AND DEVICE FOR COOLING OF ELECTRONIC/COMPUTER EQUIPMENT AND USE THEREOF

BACKGROUND OF THE INVENTION

FIELD OF THE INVENTION

The present invention relates, according to a first aspect, to one for cooling of electronic- and/or computer equipment in a station. According to a second aspect, the invention relates to an air guiding device which is especially suited to be utilized in such a cooling system. According to a third aspect, finally, the invention relates to one for cooling of such equipment.

DISCUSSION OF THE BACKGROUND

Power for operation of the cooling systems which serve medium sized and big telephone exchanges normally costs between 40% and 75% of the power for operation of the exchange itself.

Normally such systems are served by cooling agent compressors, which require big resources with regard to operation, attendance and maintenance. Besides, the cooling agents, which are normally used in such, are harmful to the environment if they should leak out.

Efforts therefore have been made to manage the problems which have been related to conventional technology in the field. Consequently there is described in SE 95-02322-2 a cooling system which is more power saving, more reliable, requiring less maintenance and in addition is more friendly to the environment due to the fact that freon or other harmful fluor containing cooling agents are not used.

A cooling system of this kind is based on the fact that the temperature in the cooling battery is only a few degrees lower than the temperature in the equipment.

At that air at low speed is sucked in through an inlet part of the battery. The air is at that warmed up by the equipment. By depression effected by the circulation fan, sufficient operation power is given to make it pass the cooling battery where it is cooled.

When the air after that has passed the circulation fan and is pressed out through its outlet, it will have a high degree of turbulence, which also means partially high speeds and high dynamic pressures.

According to Bernoulli's equation there will be low statical pressures in parts of the outgoing air flow.

$$P_{tot} = P_1 + 0{,}5 \cdot \rho \cdot V^2,$$

where $P_{tot}$=total pressure $P_1$=static pressure, and $0{,}5 \cdot \rho \cdot V^2$=dynamic pressure The low static pressure, which will be a consequence of the turbulent flow, causes a problem by air from the surroundings tending to be sucked into the cooling air flow. This will result in that, in the first place, there will be a very disadvantageous distribution of speed over the surface which constitutes outlet for the cooling air and where the speed in the part which is closest to the fan will be in wrong direction. In the second place, the outgoing air flow will be a number of degrees warmer than if the cooled down process air could reach the equipment directly. This as a consequence of the air which is mixed into it from the surroundings.

One way to compensate this could be to reduce the temperature in the heat transfer medium to the battery. This, however, would require considerably increased cooling power and in addition not be in accordance with the concept according to the above mentioned Swedish patent application where operation with high heat transfer medium temperatures for free cooling is applied.

The objective of the present invention is, in the light of this, to try to effect the cooling in such a way that the above discussed increase of the temperature of the air, in its path from the battery to the equipment, is avoided.

Owing to that the air guiding devices in the system which guide the air from the battery to the equipment have double chambers, laminar flow can be obtained from the air guiding device if one sees to it that the partition wall which separates these is designed as a low impulse device with such a flow resistance that in the first chamber a static pressure is built up which is exactly adjusted to bridge the static pressure in the second pressure chamber, which gives as close a laminar flow as possible, so that temperature increasing mixing in of warm surrounding air is eliminated, or is at least strongly reduced. To this will also contribute the fact that the design with two chambers separated by the impulse device gives possibility to, by suitably directed angle of the impulse device, effect one on the whole uniform speed of the air flow, which further reduces the risk of mixing in of warmer air.

SUMMARY OF THE INVENTION

The invention is especially intended to be utilized, and its advantages will be especially prominent, when the cooling battery is of a kind which communicates with one outside the room located cooler via pipe lines for heat transfer medium, especially of the kind which operates with small temperature differences, by which here is meant totally less than 5° C. Such an application of the invention therefore constitutes a preferred embodiment of the invention.

The invention is especially effective when the fan of the system is located on the outlet side of the battery, because the problem with air turbulences then is most accentuated. Such an embodiment therefore constitutes a preferred embodiment of the invention.

Suitably the impulse device consists of an air pervious partition wall, which is a simple and appropriate way to realize this. By that a good result is effected if the partition wall consists of a plate with perforations of suitable allocation and size. The perforated plate is preferably completed with a filter mat/cloth.

In another preferred embodiment of the system the partition wall is slanting so that air flowing into the first chamber has a direction which deviates more from the perpendicular direction towards the plane of the partition wall than the flow direction of the outlet air from the second chamber. This is of great importance to effect the homogenous distribution of speed, at which the angle of the plate is selected with this in view.

The invented system is in one embodiment designed with battery and air guiding device in a separate room, separated from the equipment room, which can be one in some applications advantageous alternative.

At an alternative preferred embodiment of the invention the air guiding device is instead designed as a special air guiding device. This has great advantages because old stations can utilize these and they can be located in the equipment room itself. Further, a production in series, and by that rational production of such air guiding devices, can be made.

According to preferred embodiments of the invented procedure, it is applied at a system according to the first aspect of the invention and/or at utilization of an air guiding device according to the second aspect of the invention.

BRIEF DESCRIPTION OF THE DRAWINGS

The invention is further explained by the following detailed description of preferred embodiments of it, with references to enclosed figures in which.

DETAILED DESCRIPTION OF THE PREFERRED EMBODIMENTS

Figure 1:
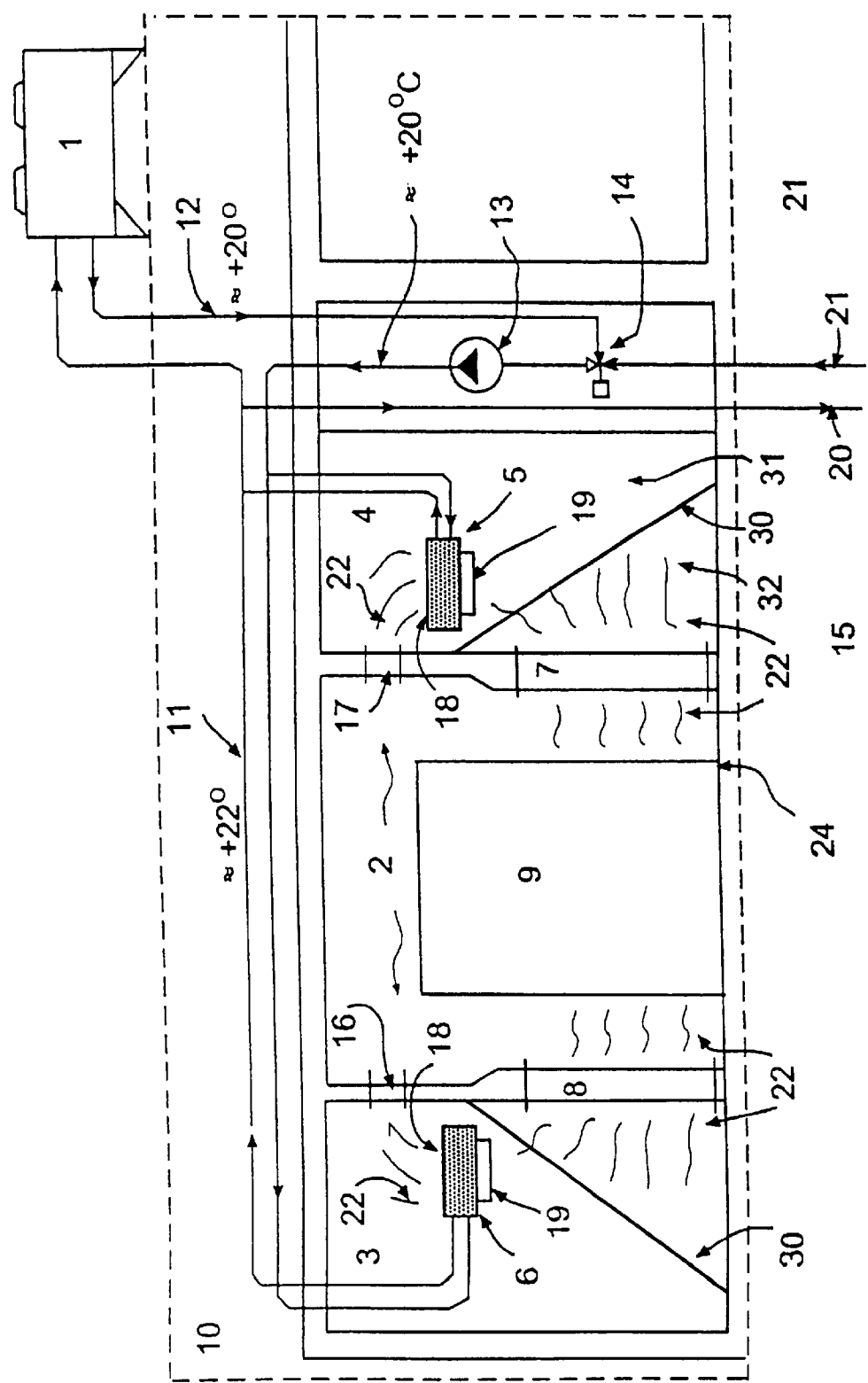
FIG. 1 is a length cut through a station equipped with a system according to a first embodiment of the invention.

In FIG. 1 is shown a station house 10 which in an equipment room 2 ("technical hall") has an electronic- and computer equipment, for instance for an AXE-station 9. Next to this room there are two smaller rooms 3, 4 which contain cooling devices 5,6. In the walls between the room 2 and the rooms 3, 4 there are two big apertures 7,8 down at the floor 24, and two smaller apertures 16, 17 up at the ceiling, so that the rooms at these apertures 7,8,16,17 are in direct connection with each other.

The cooling devices 5,6, which each includes a cooling battery 18 and a fan 19, are located in the upper part of the rooms 3,4. These cooling devices 5,6 are connected to a cooler 1 by means of a pipe 12 for flow in forward direction, and a pipe 11 for return flow, and also to the underground water in the rock 15 via the pipe lines 20,21 and the mixing valve 14. The cooler 1 is located outside the house 10, preferably on the roof of the house.

The cooling procedure for the electronic- and computer equipment in the AXE-station will now be described only with reference to the cooling device 5, because the cooling device 6 operates in exactly the same way and has the same effect as the cooling device 5. It should of course be realized that just any wanted number of cooling devices 5, 6 can be used at the cooling procedure.

Figure 3:
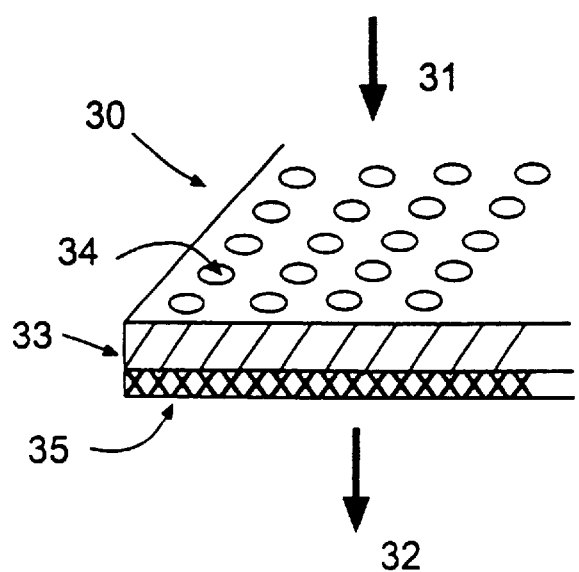
FIG. 3 is a perspective view of a detail of the invention.

The cooler 1 provides the cooling battery 18 in the cooling device 5 with water which has a temperature of about 20° C. at the forward transport pipe line 12, the mixing valve 14 and the pump 13; the pump handles the circulation of the water. The cooling battery 18 is cooled down, and cools the air 22 in the room 4. The fan 19 blows the air down towards the floor 24 in the room 4, and out through the big aperture 7 into the room 2. The air which is blown out vertically downwards from the fan 19 will at that first reach a first chamber 31 in the room 5, and be directed obliquely down towards the right in the figure by an, as a partition wall designed, impulse device 30. The partition wall 30 is designed as is shown in FIG. 3 with a perforated plate 33, or sheet, and is in addition equipped with a filter cloth 35.

Because the partition wall is oblique is effected that the speed in both x- and y direction in just any cut will be constant. From the chamber 31 the cooled air passes the perforations 34 in the partition wall and passes into a second chamber 32 of the room 5. The perforations and the filter cloth in the partition wall have been adapted in a way that a static pressure has been built up in the first chamber which is sufficiently enough higher than the statical pressure in the second chamber 32, so that the air is barely pressed through the partition wall.

Because the fall of pressure over the wall 30 is as small as possible, and because of the constant speed, a quite laminar flow out through its outlet 7 and into the room 2 is effected in the second chamber. The cooled air with a temperature of about 21° C. consequently is blown into the room 2 as a laminar, non-rotational, smooth flow (air front) with a speed of about 0.3 m/s, and passes through the electronic equipment 9 in the AXE-station, which is cooled to a temperature which may not exceed 24° C. The air which passes through the electronic equipment 9 in the AXE-station is warmed up by the energy which is emitted from this equipment 9 (about 25 kW), and rises upwards in the room because the warmed up air has lower density than the cooled air; the warmed up air 22 is then sucked back into the room 4 through the aperture 17 due to the back suction of the fan 19, and warms up the water in the cooling battery 18 to a temperature of about 22° C. The warmed up water is brought back to the cooler 1 via the return pipe 11, at which the cooler 1 again reduces the water temperature by two degrees, i.e to 20° C. The cooler 1 again provide the cooling battery 18 with water, and the above described cooling procedure will start again. It should be realized that water all the time is circulating through the cooling battery.

If, however, the outdoor temperature exceeds about +19° C., the cooler 1 will not manage to reduce the temperature of the water by 2° C. In this case chill is pumped up from the rock 15, so called "peak cooling", to the mixing valve 14 which mixes water from the cooler 1 and the rock 15, so that the temperature of the water mixture will be about 20° C.; the valve 14 consequently includes a sensor (not shown) which senses the water temperature, and the cooler a thermostat (not shown) which has a switching temperature of about 20° C.

Figure 2:
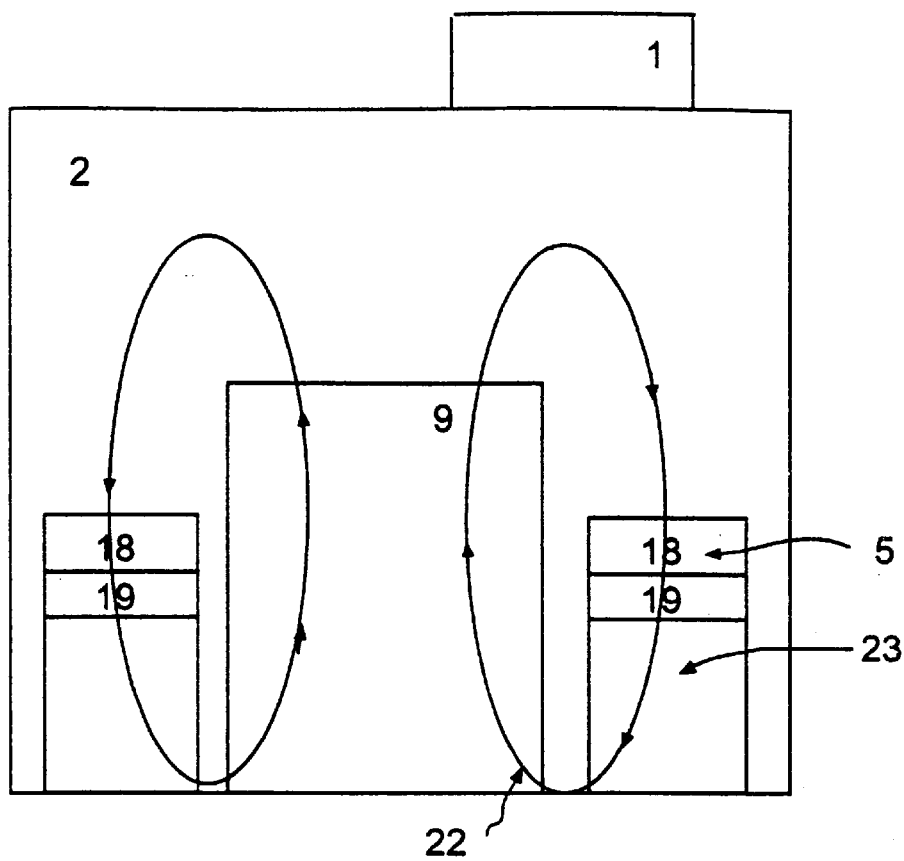
FIG. 2 is a principal diagram of a station with a system according to a second embodiment of the invention.

One problem consists of applying the cooling system according to the invention to already existing, installed AXE-stations. This problem is solved in a way which is shown in FIG. 2. The cooling device 5, including cooling battery 18 and fan 19, is installed in a separate cooling unit 23 which is placed in the "technical hall" 2 beside the AXE-equipment 9, at suitable distance from this. A cooler 1 is placed outdoors just as in the above described embodiment. The connection arrangement with pipeline for forward transport 12, and return pipeline 11, pipelines 20, 21, mixing valve 15, pump etc (not shown in FIG. 2) are installed and connected to the cooling battery and the cooler in the same way as in FIG. 1. The cooling battery 18 now will in the same way as in the embodiment according to FIG. 1 cool the surrounding air, and the fan will provide that air circulation is effected as is shown by the arrow 22. The cooling of the electronic equipment in the AXE-station, accordingly, is in this case in principle made in the same way as in the embodiment according to FIG. 1. It should be realised that just any wanted number of cooling units 23 including cooling devices 5 can be placed in the "technical hall" 2. The cooling system according to FIG. 2 is on the other hand extremely simple to install and maintain and is, in addition, considerably more power-saving than conventional cooling systems for AXE-stations.

Figure 4:
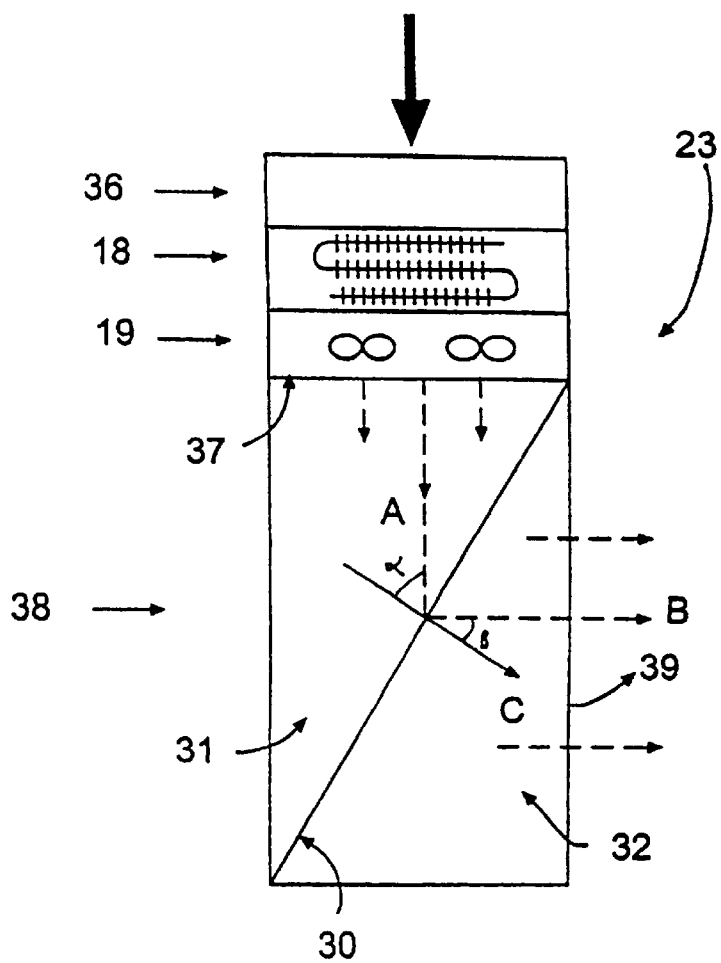
FIG. 4 is a principal diagram of a cooling device equipped with an air guiding unit according to the invention.

In FIG. 4 is illustrated in more details how the unit 23 according to one embodiment of the invention is designed.

The warm air from the equipment passes in to the cooling battery 18 through a funnel module 36, which is effected by the, by the fans 19 produced, negative pressure above the cooling battery 18. The cooled air is pressed down in an air guiding device 37 of the unit 23. The air guiding device 37 has an inlet 38 which is directed towards fan 19, and an outlet 39 which is directed towards the electronic- and computer equipment. The air guiding device 37 of the unit 23 is in similar way as the room 4 in FIG. 1, divided into two chambers 31 and 32. The air which is flowing into the first chamber 31 has vertical main flow direction, i.e. is directed as the arrow A, but contains, due to the dynamic effects of the fan on the air, vortices so that local deviations regarding speed and direction will occur.

As in the embodiment according to FIG. 1 the oblique partition wall 30 effects that a constant speed distribution is obtained when the air is passing this. The partition wall 30 is designed in principle in the same way as that which is illustrated in FIGS. 1 and 3, and effects that the air leaves the chamber 32 with laminar structure of flow in horizontal direction, illustrated by the arrow B. The air consequently moves towards the equipment which shall be cooled with uniform direction and speed, so that no warming air is mixed into it, but the entire cooling effect can be utilized for cooling of the equipment.

For obtaining a complete laminar flow also the direction of the partition wall 30 in relation to the inlet direction A and the outlet direction B is of importance, beside the characteristics of the fan unit and the design of the perforations (size, number per unit of surface) and the fineness of the filter cloth.

Through the partition wall itself the flow is directed in its perpendicular direction, the arrow C. For effecting a laminar output flow the angle between the main direction of the inlet air and the direction of the air at passage of the partition wall, should be definitely bigger than the angle β between the main direction of the output air, and the direction of the air at passage of the partition wall, by which a uniform speed of the air is obtained.

Figure 5:
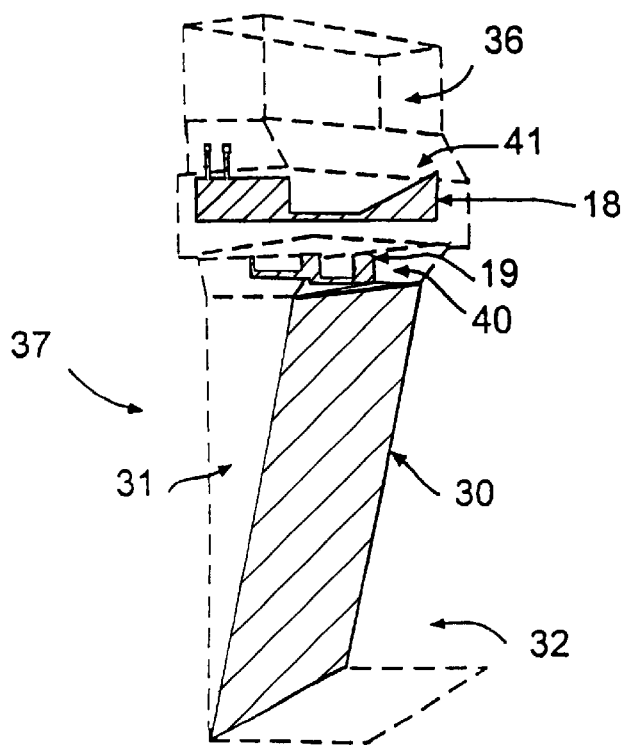
FIG. 5 is a perspective view of the unit in FIG. 4.

A unit of the in FIG. 4 shown kind is shown in a perspective view in FIG. 5.

The unit 23 can be built up of a system of modules of funnel parts, battery parts and fan device parts in different combinations with varying numbers of each part. The fan device part at that includes both fans and low impulse device.

The unit 23 in the system according to FIGS. 2, 4 and 5 above need no connections of drums for the inlets and outlets of the air, but can be placed directly in front of the rows of passages which shall be cooled.

The sound level of the unit is lower than 48 dBA at a distance of 5 meters.

The cover of the unit 23 is suitably 0.7 mm laquered steel plate, if it can have service doors 40, 41 for access to fans and cooling battery.

In the battery part of the unit there is a flange battery which is manufactured of copper pipes with pressed on segments of aluminium. The pipe dimension is 12.7 mm after expansion. The divison of the pipe is 30×25 mm. The thickness of the segments is 0.3 mm, and the division of the segments=3 mm.

The battery part is turnable which means that the same module can be used for heat transfer medium connection from left or right side.

Figure 6:
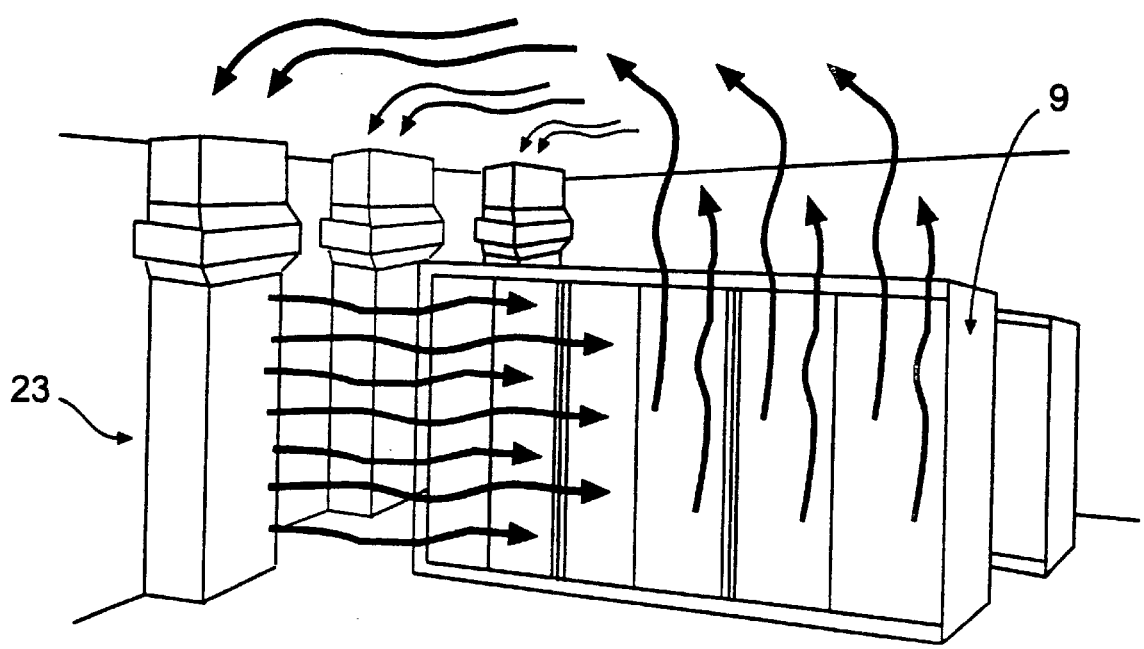
FIG. 6 is a perspective view of a control room at which a unit according to FIG. 5 is used.

In FIG. 6 is illustrated units 23, arranged in a room with electronic/computer equipment, from what can be seen the main structure of the air circulation with horizontal flow of warm air under the ceiling of the room from the equipment 9 to the unit 23, in which the air on the whole flows vertically downwards and is cooled down to a temperature of about 1° C. over the temperature of the heat transfer medium, to after that flow horizontally out to the equipment 9 where the air finally rises while it is warmed up, at which the system operates with deplacing air injection technology.

At cooling of equipment in a room with the temperature 24° C. and with heat transfer medium temperatures of 20/23.6° C., a unit 23 according to the above provide 6.2 kW cooling effect at about 175 W operating power and with an air quantity of about 2900 $m^3$ /timma.

What is claimed is:

1. A cooling system for cooling electronic equipment arranged in an equipment room, comprising:

a fan device and a cooling battery, the fan device being configured to effect a circulating air flow for emission of heat from the air to the battery and absorption of heat from the electronic equipment, to the air an air guiding device configured to guide the air from the battery to the equipment, the air guiding device comprising a first chamber having a communicating air inlet which communicates the air to the battery, a second chamber having a communicating air outlet which communicates the air to the equipment, and a partition positioned between the first and second chamber and configured to create a substantially laminar flow of said air from said air outlet.

2. The cooling system according to claim 1, wherein a forward transport pipe and return transport pipe are connected between said cooling battery and a cooler arranged outside the equipment room, said cooling battery having a heat transfer medium which operates with a temperature difference, between a warm and cold temperature, of less than 5° C.

3. The cooling system according to claim 1, wherein the fan is connected to the air outlet of the battery, and is located between the battery and the air guiding device.

4. The cooling system according to claim 1, wherein the partition comprises an air pervious partition wall.

5. The cooling system according to claim 4, wherein the air pervious partition wall includes a perforated plate.

6. The cooling system according to claim 5, wherein the air pervious partition wall includes a filter mat/cloth.

7. The cooling system according to claim 4, wherein the air pervious partition wall forms a plane configured such that a perpendicular of the plane forms a first angle to a main flow direction of the air through the inlet.

8. The cooling system according to claim 7, wherein the perpendicular forms a second angle to a main flow direction of the air through the outlet.

9. The cooling system according to claim 8, wherein said first angle is bigger than said second angle.

10. The cooling system according to claim 1, wherein an outlet direction of the air guiding device and an inlet direction intersect to substantially form a right angle to each other.

11. The cooling system according to claim 1, wherein said battery is arranged in a battery room which is divided into said first and second chamber and is separated from said equipment room by means of a wall which includes a first air opening at the top of the wall and arranged for transport of warm air from the equipment to the battery, and includes a second air opening at the bottom of the wall and arranged for transport of cooled air from the battery to the equipment, wherein said second air opening, communicates with said second chamber in the battery room.

12. The cooling system according to claim 1, wherein the air guiding device and the fan forms a building module connectable as a building module designed battery.

13. A method for cooling electronic equipment arranged in an equipment room, comprising:

circulating air by use of fan devices so that the air flows over the electronic equipment to absorb heat from the electronic equipment and then over a cooling battery to be cooled by the battery, from where the cooled air again flows to the equipment, wherein the air which flows from the battery to the equipment is forced to pass through an inlet to a first chamber, from the first chamber through a partition to a second chamber, and from the second chamber through an outlet to the equipment in a substantially laminar flow.

14. The method for cooling according to claim 13, wherein a cooling system is utilized to provide the cooling battery with the ability to cool the air.

15. The method for cooling according to claim 13, wherein an air guiding device is used to facilitate said circulating of the air.

* * * * *